United States Patent [19]

Huang et al.

[11] Patent Number: 5,897,925
[45] Date of Patent: Apr. 27, 1999

[54] FOG-RESISTANT MICROPOROUS SIOH FILMS AND THE METHOD OF MANUFACTURING THE SAME

[75] Inventors: Daoyang Huang, Hsinchu; Chao-Tsang Wei, Taipei, both of Taiwan

[73] Assignee: Industrial Technology Research Institute, Hsinchu, Taiwan

[21] Appl. No.: 08/623,505

[22] Filed: Mar. 28, 1996

[51] Int. Cl.$^6$ ............................... H05H 1/24; B05D 3/00
[52] U.S. Cl. .................. 427/579; 427/248.1; 427/353; 427/354
[58] Field of Search ................ 428/447, 332, 428/336, 428, 409; 427/452, 574, 579, 248.1, 353, 354

[56] References Cited

U.S. PATENT DOCUMENTS

| | | | |
|---|---|---|---|
| 4,214,908 | 7/1980 | Deguchi et al. | 106/13 |
| 4,242,412 | 12/1980 | Funaki et al. | 428/412 |
| 4,478,909 | 10/1984 | Taniguchi et al. | 428/331 |
| 4,847,160 | 7/1989 | Munz et al. | 428/447 |
| 5,075,133 | 12/1991 | Hosono et al. | 427/162 |
| 5,134,021 | 7/1992 | Hosono et al. | 428/213 |
| 5,225,274 | 7/1993 | Ogawa et al. | 428/333 |
| 5,270,080 | 12/1993 | Mino et al. | 427/430 |
| 5,324,543 | 6/1994 | Ogawa et al. | 427/387 |
| 5,487,920 | 1/1996 | Lopata et al. | 427/489 |
| 5,549,604 | 8/1996 | Sutcu et al. | 606/45 |

OTHER PUBLICATIONS

Optical Engineering, Sep. 1995, vol. 34, No. 9, "Application of Plasma Polymerization on Ophthalmic Lenses: Equipment and Processes"; p. 2712.

*Primary Examiner*—Hoa T. Le
*Attorney, Agent, or Firm*—Ladas & Parry

[57] ABSTRACT

A fog-resistant microporous transparent film and the method of manufacturing the same are described. The fog-resistant film is made of SiOH which can absorb water molecules by both of a polar —Si—OH functional group and microporosity, and is hence provided with excellent and stable wettability. The SiOH film is coated on a PMMA or PC substrate by ion-assisted plasma-enhanced e-beam or thermal evaporation.

22 Claims, No Drawings

FOG-RESISTANT MICROPOROUS SIOH FILMS AND THE METHOD OF MANUFACTURING THE SAME

BACKGROUND OF THE INVENTION

1. Field of the Invention

The present invention relates to a fog-resistant film which can be applied on plastic or glass substrates, and more particularly relates to a fog-resistant microporous SiOH film which can absorb water molecules by both the polar —Si—OH functional group and microporosity, and the method for manufacturing the SiOH film.

2. Description of Prior Art

Water vapor is easily condensed on both glass or plastic surfaces due to a thermal or moisture differential, thereby degrading the transparency and function of a lens made of glass or plastic. However, the above problem can be solved by coating a fog-resistant film on the surface of the lens.

There are, some different ways of forming a fog-resistant film in prior arts. For example, in U.S. Pat. Nos. 4,242,412, 4,332,859 and 5,075,133, they disclose a dipping method which coats a layer of high molecular-weight mixed film including many —C—OH functional groups on a substrate by dipping the substrate into the coating solution. Further, U.S. Pat. No. 4,214,908 describes a composite film of an inorganic salt and an ionic surface-active agent of long-chained molecular structure including a —$SO_3$ base. Moreover, U.S. Pat. Nos. 4,478,909 and 5,134,021 provide a single layer or multiple layers of composite film including polyvinyl alcohol, silica nodules and organic silicon compound, the film generates a part of —Si—OH functional group after hydrolysis, therefore it has excellent anti-fogging ability. Another prior art is described in Application of plasma polymerization on ophthalmic lenses: equipment and processes'written by Christian Wohlrab et al. in OPTICAL ENGINEERING, Sep. 1995, Vol. 34, No. 9, which discloses a polymer anti-fogging film including —C=O and —C—OH functional groups incorporated on ophthalmic lenses by plasma polymerization.

SUMMARY OF THE INVENTION

Accordingly, the object of the present invention is to provide a fog-resistant microporous film which has only one single layer and is made of SiOH.

Another object of the present invention is to provide a method for forming a fog-resistant microporous transparent film on a PMMA or polycarbonate substrate, so that ophthalmic lenses made of the PMMA or polycarbonate substrate coated with a fog-resistant microporous film have excellent and stable anti-fogging properties.

The fog-resistant microporous SiOH film of the present invention is formed on a glass or plastic substrate with a thickness of about 100 nm by plasma-assisted vacuum coating. The coating material employed is silicon monoxide, and the film can be coated by e-beam evaporation or thermal evaporation which is assisted by $H_2$ and Ar plasma.

The fog-resistant microporous film of this invention has excellent and stable wettability since it absorbs water molecules by both a polar —Si—OH functional group and microporosity. The principle is as follows: the coating material, silicon monoxide, becomes vapour phase after being bombarded by e-beam or heated by heater. The vapour phase of silicon monoxide collides with the H atoms of $H_2$ plasma and forms a vapour phase of SiOH while coating. These SiOH molecules collide with and stick to the surface of the substrate to form a layer of transparent SiOH film. As the film forms, since one end of the silicon atom has already connected with OH functional group and cannot form bonds with other silicon atoms or oxide atoms, thus a microporous film can be easily formed while forming cross-linking space-network. The microporosity which is uniformly distributed at the surface of and in the film tends to absorb and retain water molecules, hence provides the film with excellent wettability.

Compared with the conventional dipping method, the present invention has the following advantages:

(i) by using vacuum coating, it does not need to recover the coating solution, and is hence able to reduce the contamination;

(ii) the fog-resistant microporous film of this invention has more excellent and stable wettability than the prior arts, since it absorbs water molecules by both a polar —Si—OH functional group and microporosity; and (iii) using silicon monoxide as the coating material may reduce the initial cost of the fog-resistant film of the present invention, so that the fog-resistant microporous SiOH film is suitable for mass production.

DETAILED DESCRIPTION OF THE PREFERRED EMBODIMENTS

Two preferred embodiments are used to describe the process of manufacturing a fog-resistant microporous SiOH film according to the present invention:

Embodiment 1

In this embodiment, a PMMA substrate is used and cleaned by rubbing its surface with alcohol and drying it up with compressed air. Then the PMMA substrate is sent into a vacuum coating device (System No. Leybold AG 1104). The chamber of the coating device is pumped down to about $2\times10^{-5}$ torr. Thereafter, using SiO as the coating material, a layer of fog-resistant SiOH film with a thickness of about 100 nm is coated on the PMMA substrate by utilizing ion-assisted plasma-enhanced e-beam evaporation, in which the flow rate of $H_2$ being conducted in the chamber is 30 sccm, the flow rate of Ar conducted in the chamber is 17 sccm, and the deposition rate of SiOH film remains at 0.5 nm/sec.

The formed microporous SiOH film remains intact through 3M-manufactured tape testing and demonstrates excellent adhesion. To further test the fog-resistant ability of the SiOH film, the following testing cycle is repeated to test the PMMA substrate coated with a SiOH film. The cycle comprises the steps of:

(1) laying the coated PMMA substrate over hot water of about 95° C. at a position of about 5-cm height for about 1 minute;

(2) checking the formation and distribution of fog or droplets on the surface of the PMMA substrate;

(3) removing the PMMA substrate from the hot water and exposing the PMMA substrate to air over 30 minutes; and (4) repeating steps (1) to (3) until the fog-resistant ability deteriorates.

The test result reveals that the microporous SiOH film of the present invention can pass at least 35 testing cycles.

Embodiment 2

In this embodiment, a polycarbonate (PC) substrate is used and cleaned by rubbing its surface with alcohol and drying it with compressed air. Then the PC substrate is sent into a vacuum coating device (System No. Leybold AG 1104). The chamber of the coating device is pumped down to about $2\times10^{-5}$ torr. Thereafter, using SiO as the coating material, a layer of fog-resistant SiOH film with a thickness of about 100 nm is coated on the PC substrate by utilizing ion-assisted plasma-enhanced e-beam evaporation, in which the flow rate of $H_2$ conducted in the chamber is 30 sccm, the flow rate of Ar conducted in the chamber is 17 sccm, and the deposition rate of SiOH film remains at 0.5 nm/sec.

The formed microporous SiOH film remains intact through 3M-manufactured tape testing and shows excellent adhesion. To further test the fog-resistant ability of the SiOH film, the following testing cycle is repeated to test the PC substrate coated with a SiOH film. The cycle comprises the steps of:

(1) dipping the PC substrate into water for about 10 seconds, removing the water left on the surface of the PC substrate after dipping, and laying the coated PC substrate over hot water of about 95° C. at a position of about 5-cm height for about 1 minute;

(2) checking the formation and distribution of fog or droplets on the surface of the PC substrate;

(3) removing the PC substrate from the hot water and exposing the PC substrate to air over 30 minutes; and (4) repeating steps (1) to (3) until the fog-resistant ability deteriorates.

The test result reveals that the microporous SiOH film of the present invention can pass at least 50 testing cycles, and demonstrates good wettability throughout.

What is claimed is:

1. A method of manufacturing a fog-resistant microporous transparent film by Plasma-assisted vacuum coatinq, the method comprising the steps of:

(i) providing a vapor phase of SiOH; and (ii) allowing molecules of the SiOH to collide with and stick to a surface of a substrate in a vacuum to form a layer of fog-resistant SiOH film on the surface of the substrate.

2. A method as claimed in claim 1 wherein the vapor phase of SiOH is formed by providing a vapor phase of SiO and allowing H atoms of an $H_2$ plasma to collide with the SiO to form the vapor chase of SiOH.

3. A method as claimed in claim 2 wherein the vapor chase of SiO is formed by bombarding SiO with an e-beam or by heating the SiO.

4. A method as claimed in claim 3 wherein the layer consists essentially of SiOH.

5. A method as claimed in claim 1 wherein the layer of SiOH film is formed with a thickness of about 100 nm.

6. A method as claimed in claim 1 wherein the substrate is glass.

7. A method as claimed in claim 1 wherein the substrate is plastic.

8. A method as claimed in claim 1, further comprising a step of processing the substrate by dipping the substrate after forming the layer of SiOH film on the surface of the substrate.

9. A method as claimed in claim 8 wherein the dipping step comprises dipping the substrate with the layer of SiOH film into water for a period of time of about 5 to 30 seconds, and removing the water left on the surface of the substrate after the dipping.

10. A method as claimed in claim 9 wherein the period of time is about 10 seconds.

11. A method as claimed in claim 1 wherein the layer of SiOH film is formed with a thickness of about 30 nm to 300 nm.

12. A method as claimed in claim 1, wherein the layer consists essentially of SiOH film.

13. A method as claimed in claim 12, further comprising the step of dipping the substrate coated with the SiOH film into water for about 5 to 30 seconds, and removing the water left on the surface of the substrate after the dipping.

14. A method as claimed in claim 1, wherein the layer of SiOH film is formed on the substrate at a rate of 0.5 nm/sec.

15. A method as claimed in claim 1, wherein the substrate is cleaned prior to step (ii) by rubbing the substrate with alcohol and drying the substrate with air.

16. A method as claimed in claim 1, wherein Ar plasma is used to assist in the formation of the SiOH film on the surface of the substrate.

17. A method as claimed in claim 1, wherein the substrate is a PMMA substrate or a polycarbonate substrate.

18. A method of manufacturing a fog-resistant microporous transparent film, comprising the steps of:

(i) selecting and cleaning a substrate; and (ii) coating a layer of SiOH film on the substrate by plasma-assisted vacuum coating with a coating material, wherein the coating material consists essentially of SiO and $H_2$.

19. A method of manufacturing a fog-resistant microporous film, the method comprising:

coating a layer of SiOH film on a substrate by plasma-assisted vacuum coating with a coating material, wherein the coating material consists essentially of SiO and $H_2$.

20. A method as claimed in claim 19, wherein the SiO is a vapor phase of SiO, wherein a vapor phase of SiOH is formed by allowing H atoms of the $H_2$ plasma to collide with the SiO to form the vapor phase of SiOH, wherein during the coating step molecules of the SiOH are allowed to collide with and stick on a surface of the substrate in a vacuum to form the layer of SiOH film, and wherein the layer of SiOH film is fog-resistant.

21. A method as claimed in claim 20, wherein the vapor phase of SiO is formed by bombarding SiO with an e-beam or by heating the SiO.

22. A method as claimed in claim 20, wherein Ar plasma is used to assist in the coating of the SiOH film on the surface of the substrate.

* * * * *